United States Patent [19]
Kim

[11] Patent Number: 5,898,187
[45] Date of Patent: *Apr. 27, 1999

[54] THIN FILM TRANSISTOR

[75] Inventor: Woong-Kwon Kim, Kyungki-do, Rep. of Korea

[73] Assignee: LG Electronics Inc., Seoul, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/713,074

[22] Filed: Sep. 12, 1996

[30] Foreign Application Priority Data

Sep. 12, 1995 [KR] Rep. of Korea .................. 95-29681

[51] Int. Cl.⁶ .................. H01L 29/04; H01L 31/036; H01L 29/76
[52] U.S. Cl. .................. 257/57; 257/59; 257/66; 257/72
[58] Field of Search .................. 257/57, 59, 66, 257/72

[56] References Cited

U.S. PATENT DOCUMENTS 5,166,816  11/1992  Kaneko et al. .................. 257/59

FOREIGN PATENT DOCUMENTS 61-182266  8/1986  Japan .................. 257/59
61-188968  8/1986  Japan .................. 257/59
 6-204247  7/1994  Japan .................. 257/57

*Primary Examiner*—Steven H. Loke
*Attorney, Agent, or Firm*—Morgan, Lewis & Bockius LLP

[57] ABSTRACT

A thin film transistor includes a substrate, a gate electrode on the substrate, an insulating layer on the gate electrode, source and drain electrodes having side surfaces facing each other over the insulating layer, a carrier traveling path between the source and drain electrodes being shorter than a length of the gate electrode, an active layer over the source and drain electrodes and the insulating layer, and a silicide layer on at least one of the side surfaces of the source and drain electrodes.

7 Claims, 7 Drawing Sheets

THIN FILM TRANSISTOR

BACKGROUND OF THE INVENTION

1. of the Invention

The present invention relates to a semiconductor device, and more particularly, to a thin film transistor and method for fabricating the same for facilitating charge transport between source and drain and reducing an operating gate voltage.

2. Discussion of the Related Art

A thin film transistor formed with an amorphous silicon layer has been widely used as a switching device of a liquid crystal display and a linear image sensor. A thin film transistor is a field effect transistor that has a metal-insulator-semiconductor (MIS) structure. Thus, it is preferable to form the thin film transistor in self-alignment similar to a conventional MOS transistor. This is because, in this way, it is possible to reduce the parasitic capacitance and simplify photolithography.

A conventional method for fabricating a thin film transistor will be explained below with reference to FIGS. 1a and 1b. As shown in FIG. 1a, a conductive layer is deposited on a transparent insulating substrate 1, and patterned to form a gate electrode 2. Then, a gate insulating layer 3 is deposited on the overall surface of the substrate. An amorphous silicon layer 4 is formed on the gate insulating layer 3. An impurity-doped semiconductor layer 5 is deposited on the amorphous silicon layer 4.

As shown in FIG. 1b, a metal is deposited on the impurity-doped semiconductor layer 5, and patterned to form source and drain electrodes 6. A predetermined portion of the impurity-doped semiconductor layer 5 is selectively etched using the source and drain electrodes 6 as a mask. Then, a passivation layer 7 is deposited and selectively etched to form a contact hole which exposes a portion of the source or the drain electrode 6. A transparent conductive layer is deposited on the overall surface of the substrate and patterned to form a pixel electrode 8. The pixel electrode 8 is connected to the source or the drain electrode 6 through the contact hole, and thus, completing the thin film transistor.

In the above mentioned conventional method, an ohmic contact layer can be made of silicide. In this case, instead of depositing an impurity doped semiconductor layer, reaction of the amorphous silicon layer 4 with the metal forming the source and drain electrodes 6 can be utilized to form the ohmic contact layer.

SUMMARY OF THE INVENTION

Accordingly, the present invention is directed to a method for fabricating a thin film transistor that substantially obviates one or more of the problems due to limitations and disadvantages of the related art.

An object of the present invention is to provide a method for fabricating a thin film transistor having a short carrier traveling path using a simpler process than in the conventional method.

Another object of the present invention is to provide a method for fabricating a thin film transistor for facilitating charge transport between the source and drain and reducing an operating gate voltage.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a thin film transistor includes the steps of forming a gate electrode on a transparent insulating substrate; forming a gate insulating layer on the overall surface of the substrate; forming a metal layer on the gate insulating layer; patterning the metal layer to form source and drain electrodes; forming a silicon layer on the substrate on which the source and drain electrodes are formed; patterning the silicon layer into an active layer pattern; carrying out heat treatment; and forming a pixel electrode to be connected to the source and drain electrodes.

In another aspect, the present invention provides a method for fabricating a thin film transistor having a substrate comprising the steps of forming a gate electrode on the substrate; forming a gate insulating layer on the gate electrode and the substrate; forming source and drain electrodes having side surfaces facing each other on the gate insulating layer; forming an active layer over the source and drain electrodes and the gate insulating layer; and forming a silicide layer on at least one of the side surfaces of the source and drain electrodes.

In another aspect, the present invention provides a method for fabricating a transistor having a substrate comprising the steps of forming a gate electrode on the substrate; forming an insulating layer over the gate electrode and the substrate; forming source and drain electrodes having side surfaces facing each other over the gate insulating layer; forming an active layer over the source and drain electrodes and the insulating layer above the gate electrode; forming a silicide layer on at least one of the side surfaces of the source and drain electrodes; forming a pixel electrode in contact with one of the source and drain electrodes; and forming a passivation layer over the active layer, the source and drain electrodes, and the pixel electrodes.

In another aspect, the present invention provides a method for fabricating a transistor having a substrate comprising the steps of forming a gate electrode on the substrate; forming an insulating layer over the gate electrode and the substrate; forming source and drain electrodes having side surfaces facing each other over the gate insulating layer; forming an active layer over the source and drain electrodes and the insulating layer above the gate electrode; forming a silicide layer on at least one of the side surfaces of the source and drain electrodes; forming a passivation layer over the active layer, the source and drain electrodes, and the insulating layer, the passivation layer having a contact hole exposing a portion of one of the source and drain electrodes; and forming a pixel electrode in contact with one of the source and drain electrodes through the contact hole.

In another aspect, the present invention provides a thin film transistor comprising a substrate; a gate electrode on the substrate; an insulating layer on the gate electrode; source and drain electrodes having side surfaces facing each other over the insulating layer; an active layer over the source and drain electrodes and the insulating layer; and a silicide layer on at least one of the side surfaces of the source and drain electrodes.

In another aspect, the present provides a thin film transistor comprising a substrate; source and drain electrodes having side surfaces facing each other over the substrate; an active layer over the source and drain electrodes and the substrate; a silicide layer on at least one of the side surfaces of the source and drain electrodes; a gate insulating layer on the active layer; and a gate electrode over the gate insulating layer.

In a further aspect, the present invention provides a method for fabricating a thin film transistor having a substrate comprising the steps of forming source and drain electrodes having side surfaces facing each other over the substrate; forming an active layer over the source and drain electrodes and the substrate; forming a silicide layer on at least one of the side surfaces of the source and drain electrodes; forming a gate insulating layer on the active layer; and forming a gate electrode over the gate insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 2A:
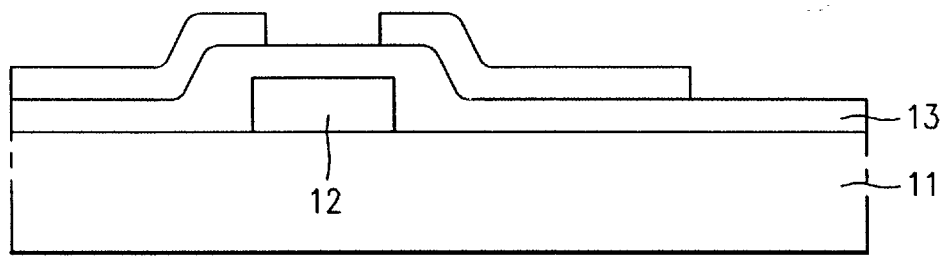
FIGS. 2a and 2b are cross-sectional views showing a method for fabricating a thin film transistor according to a first embodiment of the present invention.
Figure 2B:
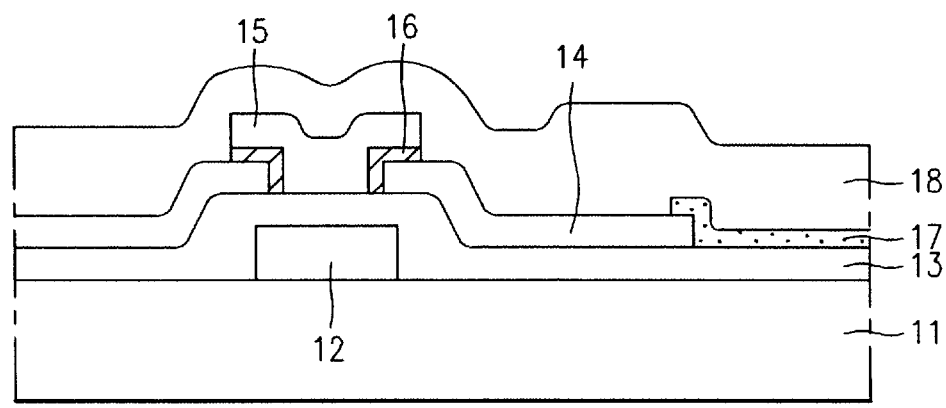

FIGS. 2a and 2b are cross-sectional views showing a method for fabricating a thin film transistor according to a first embodiment of the present invention. As shown in FIG. 2a, a conductive layer is formed on a transparent insulating substrate 11 and patterned to form a gate electrode 12. Then, SiNx is deposited to form a gate insulating layer 13. A metal is deposited on the gate insulating layer 13 and patterned to form source and drain electrodes 14.

As shown in FIG. 2b, an amorphous silicon layer 15 is formed on the source and drain electrodes 14 and the exposed portion of the gate insulating layer 13, and patterned into a predetermined active layer pattern. Then, a heat treatment is carried out to form a silicide through a reaction of the silicon of amorphous silicon layer 15 with the metal which forms the source and drain electrodes 14. Thus, an ohmic contact layer 16 is formed. It is possible to form the silicide without the heat treatment, by heating the substrate during the formation of the amorphous silicon layer.

When aluminum (Al) is used as the metal to form the source and drain electrodes, the silicide is formed at a temperature of about 250° C. For chromium (Cr), the silicide is formed at a lower temperature of about 150° C.

Then, an indium tin oxide (ITO) layer is formed and patterned to form a pixel electrode 17 connected to one of the source and drain electrodes. A passivation layer 18 is formed on the overall surface of the substrate, completing the process.

It is also possible to form the silicide which serves as an ohmic contact layer during the formation of the ITO layer for forming the pixel electrode 17 or the protective (passivation) layer 18, without using a separate heat treatment. This is because the pixel electrode can be formed at a temperature that is adequate for forming the silicide as well.

Figure 3:
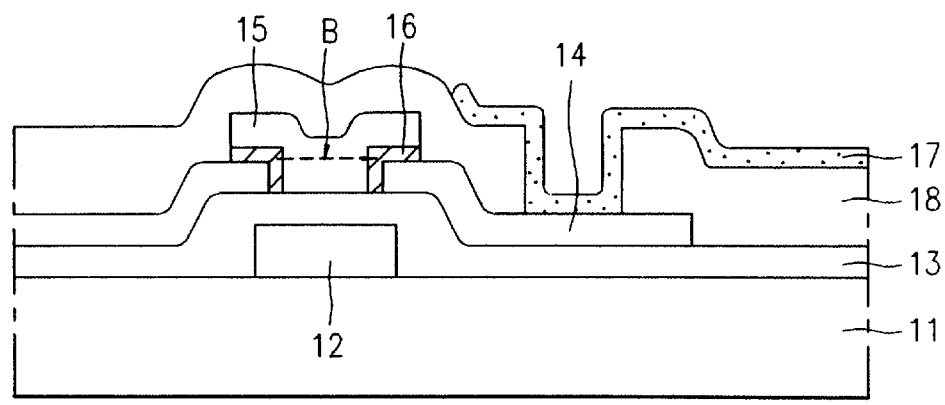
FIG. 3 is a cross-sectional view of a thin film transistor according to a second embodiment of the present invention.

FIG. 3 is a cross-sectional view of a thin film transistor according to a second embodiment of the present invention. This structure is formed similarly to the structure of the first embodiment. In the second embodiment, however, a passivation layer 18 is deposited before the ITO is formed. A contact hole is formed by selectively etching the passivation layer 18. Then, the ITO is deposited and patterned to form a pixel electrode 17. The pixel electrode 17 is connected to one of the source and drain electrodes through the contact hole.

Figure 1A:
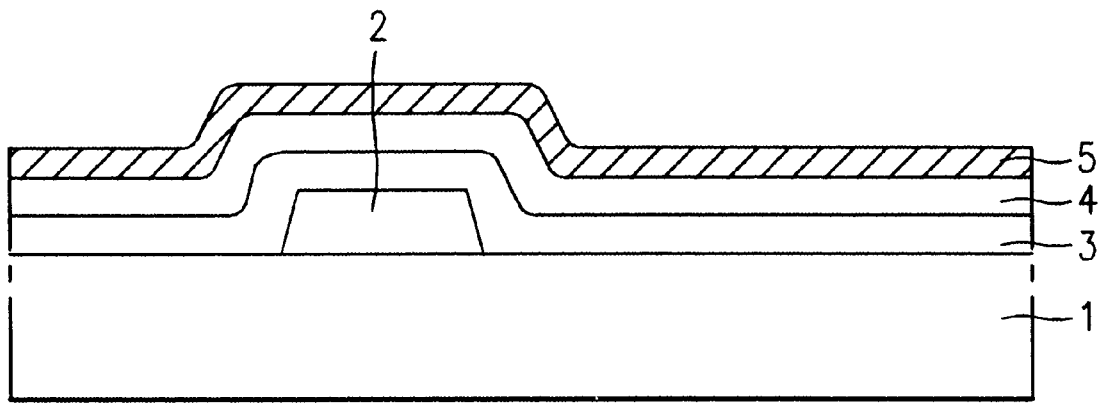
FIGS. 1a and 1b are cross-sectional views showing a conventional method for fabricating a thin film transistor.
Figure 1B:
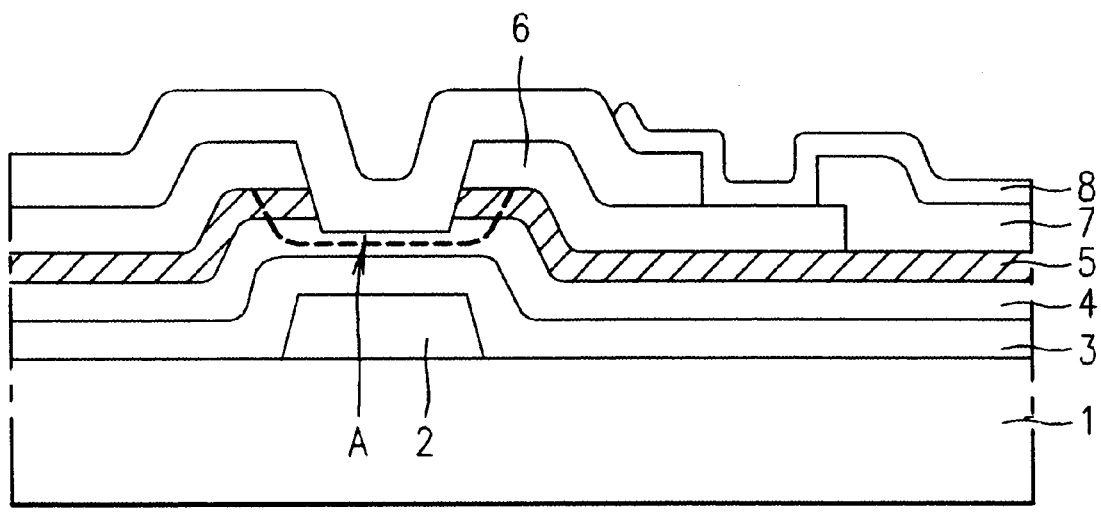

Thus, the carrier transport path or the channel ("B" in FIG. 3) of the thin film transistor according to the present invention becomes shorter than that of the conventional thin film transistor (A in FIG. 1b). Accordingly, the operating gate voltage can be reduced and the characteristic of the device is improved. Moreover, an ohmic contact layer, silicide, is formed by reaction of the amorphous silicon of the active layer with the metal of the source and drain electrodes. Therefore, the present invention has a simple process.

Figure 4:
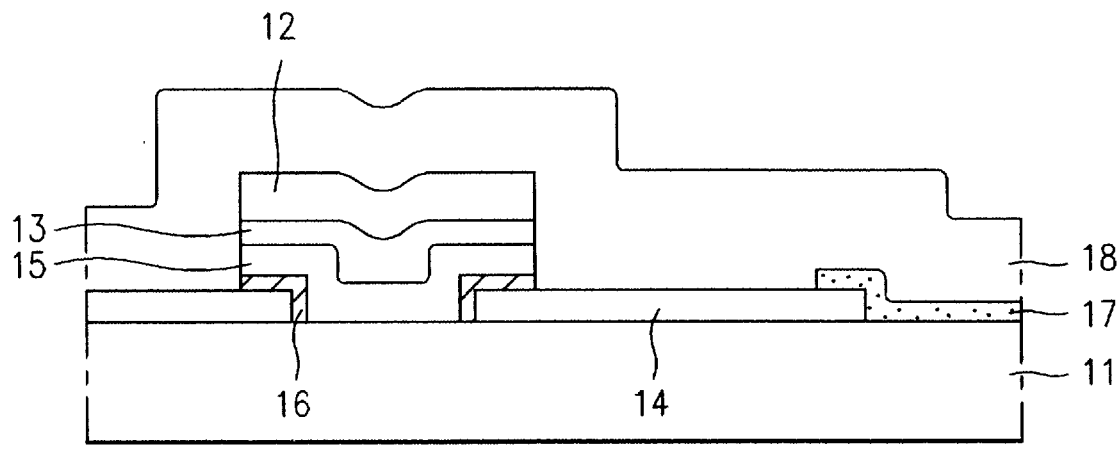
FIG. 4 is a cross-sectional view of a thin film transistor according to a third embodiment of the present invention.

FIG. 4 is a cross-sectional view of a thin film transistor according to a third embodiment of the present invention. This structure is formed similarly to the structure of the first embodiment. In the third embodiment, however, a gate insulating layer 13 is formed over an amorphous silicon layer 15, and a gate electrode 12 is formed over the gate insulating layer 13.

Referring to FIG. 4, a metal is deposited on a substrate 1 and patterned to form source and drain electrodes 14. An amorphous silicon layer 15 is formed on the source and drain electrodes 14 and patterned into a predetermined active layer pattern. As shown in FIG. 4, the amorphous silicon layer is also formed at respective sides of the source and drain electrodes 14. Then, a heat treatment is carried out to form a silicide through a reaction of the silicon of the amorphous silicon layer 15 with the metal forming the source and drain electrodes 14. Thus, an ohmic contact layer 16 is formed on as well as at respective sides of the source and drain electrodes 14.

A gate insulating layer 13 is formed and patterned on the amorphous silicon layer 13 and a gate electrode 12 is formed and patterned on the gate insulating layer 13.

An indium tin oxide (ITO) layer is formed and patterned to form a pixel electrode 17 connected to one of the source and drain electrodes 14. A passivation layer 18 is formed on the overall surface of the substrate, completing the process.

Figure 5:
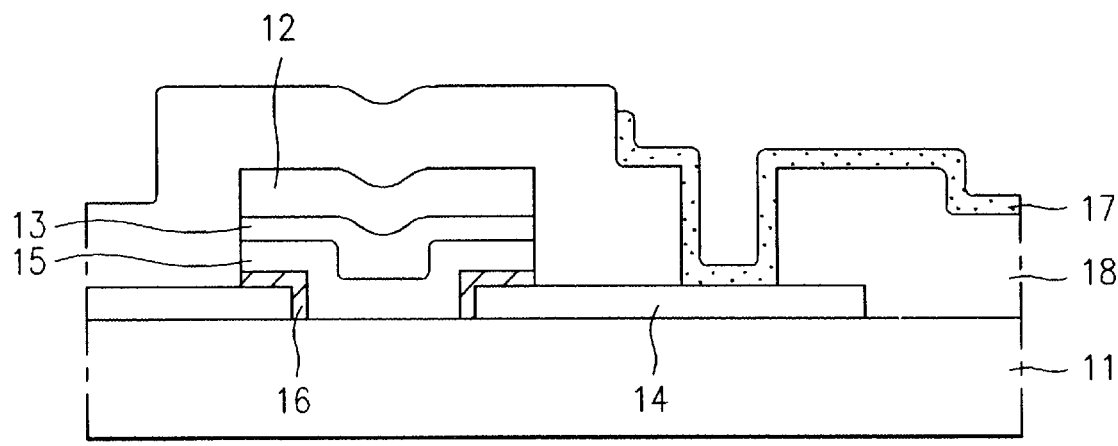
FIG. 5 is a cross-sectional view of a thin film transistor according to a fourth embodiment of the present invention.

FIG. 5 is a cross-sectional view of a thin film transistor according to a fourth embodiment of the present invention. This structure is formed similarly to the structure of the third embodiment. In the fourth embodiment, however, a passivation layer 18 is deposited before the ITO is formed. A contact hole is formed by selectively etching the passivation layer 18. Then, the ITO is deposited and patterned to form a pixel electrode 17. The pixel electrode 17 is connected to one of the source and drain electrodes through the contact hole.

Accordingly, the present invention provides a thin film transistor and method for fabricating the same for facilitating charge transport between the source and drain by shortening the channel path and thus reducing the operating gate voltage.

Figure 6A:
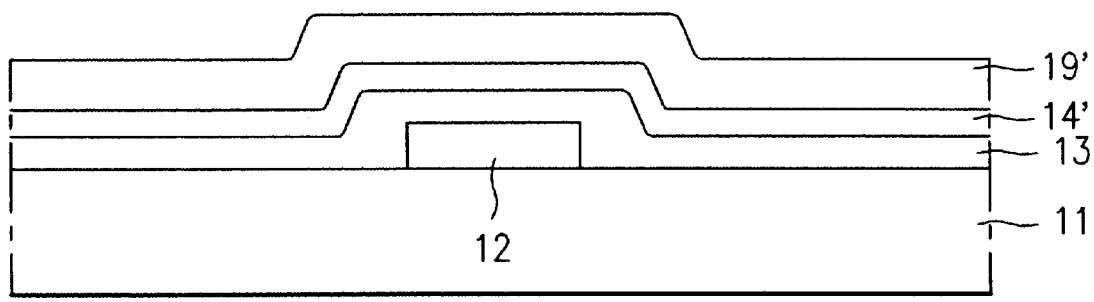
FIGS. 6a to 6e are cross-sectional views showing a method for fabricating a thin film transistor according to a fifth embodiment of the present invention.

FIGS. 6a to 6e are cross-sectional views showing a method for fabricating a thin film transistor according to a fifth embodiment of the present invention. As shown in FIG. 6a, a gate electrode 12 is formed on a substrate 11. A gate insulating layer 13 is formed on the gate electrode 12 and the substrate 11. A metal layer 14', such as Cr or Al, is formed on the gate insulating layer 13. An impurity-doped semiconductor layer 19', such as an $n^+$-amorphous silicon layer, is formed on the electrode layer 14'.

Figure 6B:
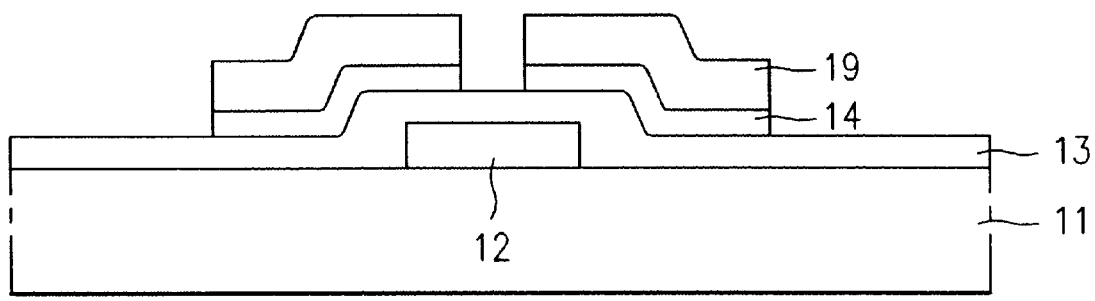

As shown in FIG. 6b, the impurity-doped semiconductor layer 19' and the electrode layer 14' are simultaneously patterned to form source and drain regions 19, and source and drain electrodes 14, respectively.

Figure 6C:
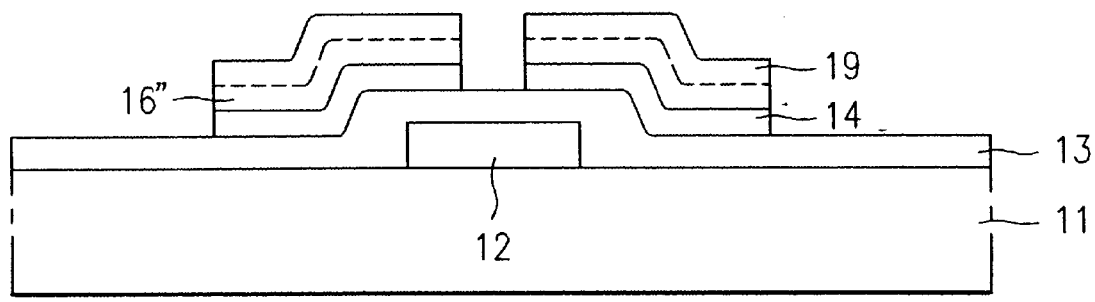

As shown in FIG. 6c, a silicide layer 16" is formed at the interface between the source and drain regions 19 and source and drain electrodes 14. The silicide layer 16" can be formed by heat treatment, for example.

Figure 6D:
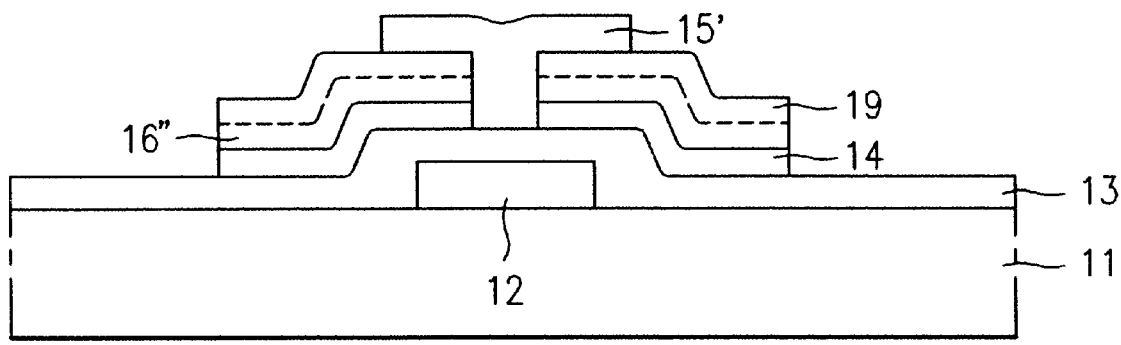

As shown in FIG. 6d, an active layer 15' is formed over the source and drain regions 19, and source and drain electrodes 14. The active layer 15' is formed of amorphous silicon, for example.

The silicide layer 16" can be formed simultaneously with the active layer 15' instead of having the separate heat treatment described above. Also, as stated in the description of the first embodiment of the present invention, the thin film transistor according to the present invention normally has an ITO layer for forming a pixel electrode, or a protective (passivation) layer. In this case, it is possible to form the silicide during the formation of the ITO layer for forming the pixel electrode or the protective (passivation) layer, without using a separate heat treatment.

Figure 6E:
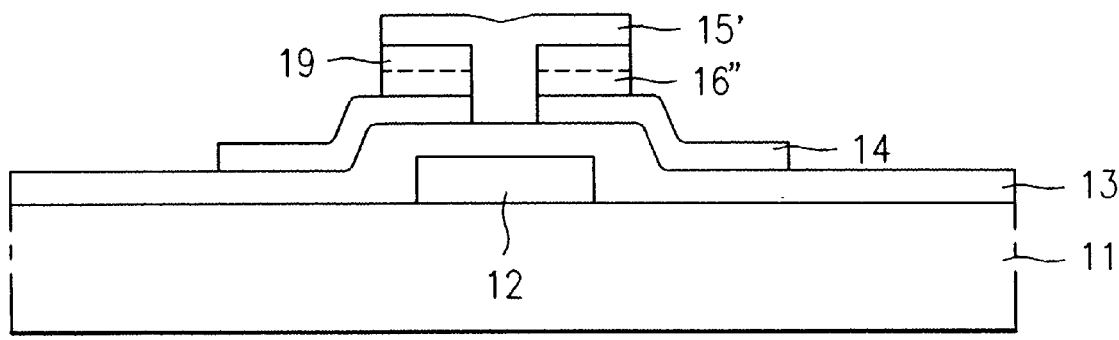

After the step shown in FIG. 6d, it is possible to remove portions of the source and drain regions 19, and the silicide layer 16", using the active layer 15' as a mask. This exposes portions of the source and drain electrodes 14 as shown in FIG. 6e.

Figure 7A:
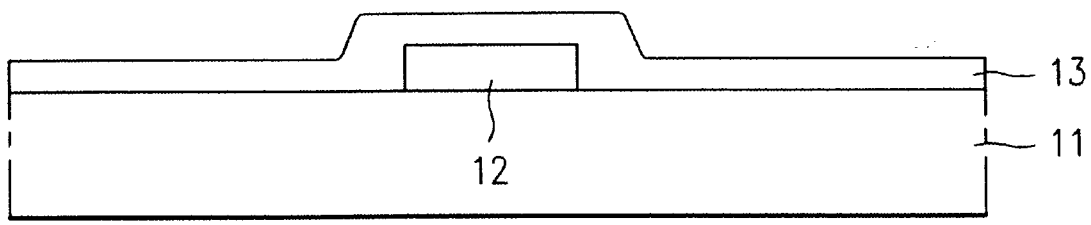
FIGS. 7a and 7f are cross-sectional views showing a method for fabricating a thin film transistor according to a sixth embodiment of the present invention.

FIGS. 7a to 7f are cross-sectional views showing a method for fabricating a thin film transistor according to a sixth embodiment of the present invention. As shown in FIG. 7a, a gate electrode 12 is formed on a substrate 11. A gate insulating layer 13 is formed on the gate electrode 12 and the substrate 11.

Figure 7B:
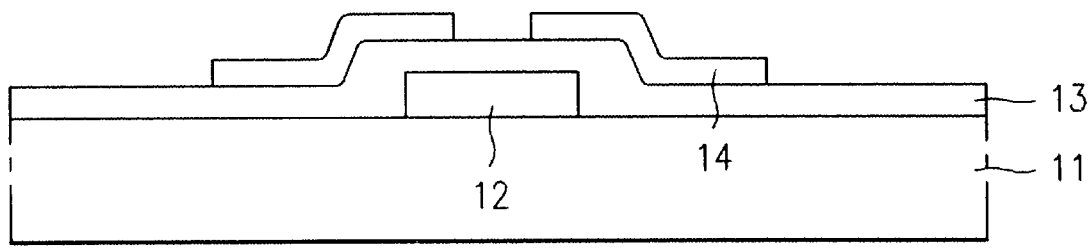

As shown in FIG. 7b, a metal layer, such as Cr or Al, is formed on the gate insulating layer 13 and patterned to form source and drain electrodes 14.

Figure 7C:
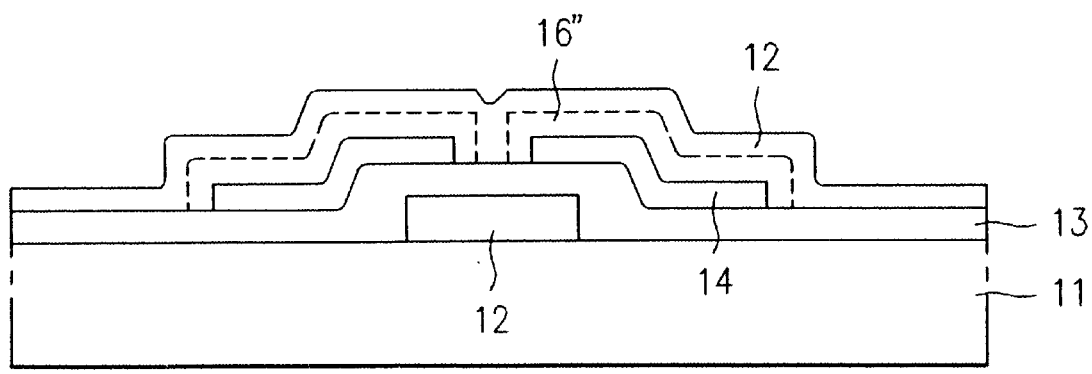
Figure 7D:
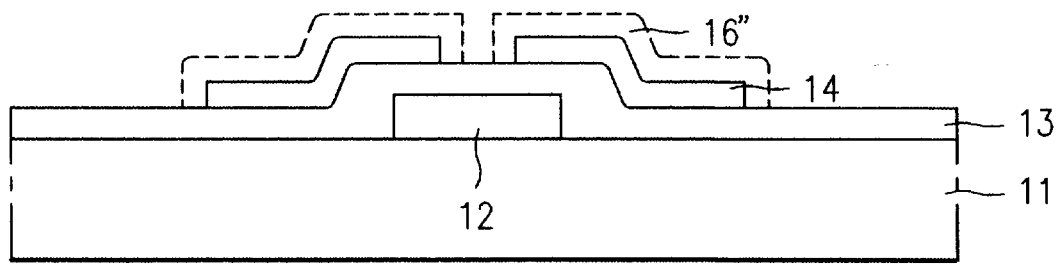

As shown in FIG. 7c, an impurity-doped semiconductor layer 19', such as an $n^+$-amorphous silicon layer, is formed on the overall surface of the substrate 11 including the source and drain electrodes 14 and the gate insulating layer 13. Subsequently, heat treatment is carried out to form a silicide layer 16". After forming the silicide layer, the impurity-doped semiconductor layer 19' is removed, as shown in FIG. 7d.

Figure 7E:
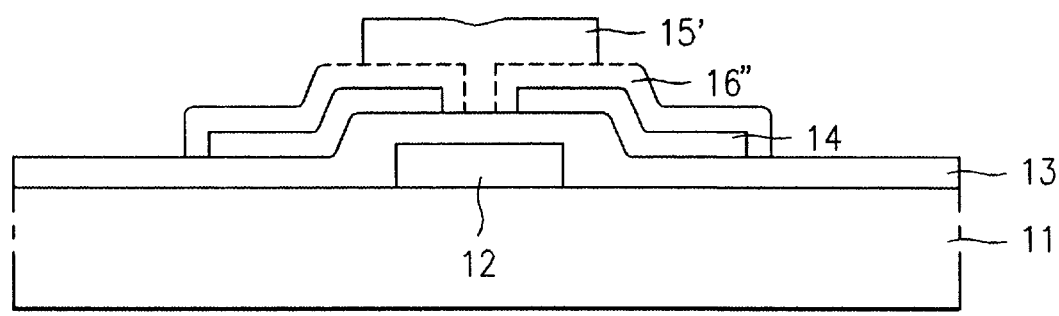

As shown in FIG. 7e, an active layer 15' is formed over the silicide layer 16" and the source and drain electrodes 14. The active layer 15' is formed of, for example, amorphous silicon.

Figure 7F:
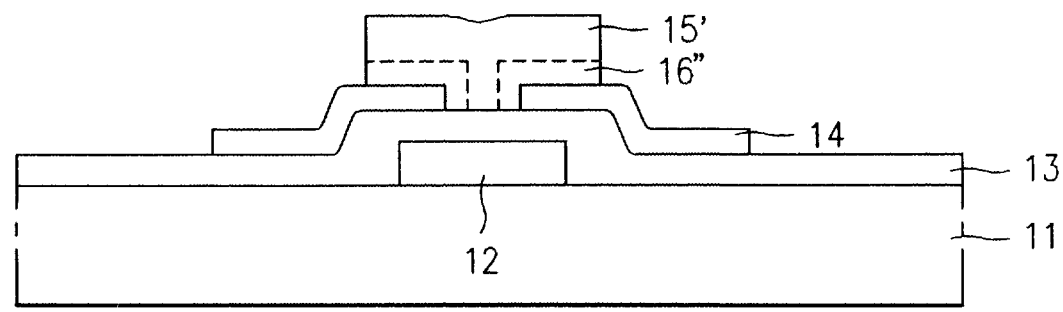

After the step shown in FIG. 7e, it is possible to remove portions of the silicide layer 16", using the active layer 15' as a mask, as shown in FIG. 7f This exposes portions of the source and drain electrodes 14.

It will be apparent to those skilled in the art that various modifications and variations can be made in the thin film transistor and method for fabricating the same of the present invention without departing from the spirit or scope of the invention. Thus, it is intended that the present invention cover the modifications and variations of this invention provided they come within the scope of the appended claims and their equivalents.

What is claimed is:
1. A thin film transistor comprising:
a substrate;
a gate electrode on the substrate;
an insulating layer on the gate electrode;
source and drain electrodes having side surfaces facing each other over the insulating layer;
an active layer over the source and drain electrodes and the insulating layer;
a carrier traveling path in the active layer between the source and drain electrodes, the carrier traveling path being shorter than a length of the gate electrode; and
a silicide layer on each of the side surfaces of the source and drain electrodes, the silicide layer having vertical and horizontal portions with respect to the substrate and contacting the active layer, the source and drain electrodes, and the insulating layer.

2. The thin film transistor according to claim 1, further comprising:
a pixel electrode in contact with one of the source and drain electrodes; and
a passivation layer over the active layer, the source and drain electrodes, and the pixel electrode.

3. The thin film transistor according to claim 1, further comprising:
a passivation layer over the active layer, the source and drain electrodes, and the insulating layer, the passivation layer having a contact hole exposing a portion of one of the source and drain electrodes; and
a pixel electrode over the passivation layer and in contact with the exposed portion of the one of the source and drain electrodes through the contact hole.

4. A thin film transistor comprising:
a substrate;
source and drain electrodes having side surfaces facing each other over the substrate;
an active layer over the source and drain electrodes and the substrate;
a silicide layer on at least one of the side surfaces of the source and drain electrodes, the silicide layer being L-shaped and having vertical and horizontal portions with respect to the substrate and contacting the active layer and at least the one of the source and drain electrodes;
a gate insulating layer on the active layer;
a gate electrode over the gate insulating layer; and
a carrier traveling path in the active layer between the source and drain electrodes, the carrier traveling path being shorter than a length of the gate electrode.

5. The thin film transistor, according to claim 4, further comprising:
a pixel electrode in contact with one of the source and drain electrodes; and a passivation layer over the gate electrode, the source and drain electrodes, and the pixel electrode.

6. The thin film transistor according to claim 4, further comprising:

a passivation layer over the gate electrode, the source and drain electrodes, and the substrate, the passivation layer having a contact hole exposing a portion of one of the source and drain electrodes; and a pixel electrode over the passivation layer and in contact with the exposed portion of the one of the source and drain electrodes through the contact hole.

7. A thin film transistor comprising:

a substrate;

a gate electrode on the substrate;

an insulating layer on the gate electrode;

source and drain electrodes over the insulating layer;

a silicide layer on each of the source and drain electrodes, the silicide layer having substantially vertical and substantially horizontal portions with respect to the substrate and contacting each of the source and drain electrodes;

an active layer over the silicide layer and the insulating layer, wherein the silicide layer includes impurities, the active layer contacting the silicide layer;

a carrier traveling path in the active layer between the source and drain electrodes, the carrier traveling path being shorter than a length of the gate electrode.

* * * * *